(12) United States Patent
Igarashi et al.

(10) Patent No.: US 8,264,277 B2
(45) Date of Patent: Sep. 11, 2012

(54) DIFFERENTIAL AMPLIFIER CIRCUIT

(75) Inventors: Atsushi Igarashi, Chiba (JP); Masahiro Mitani, Chiba (JP)

(73) Assignee: Seiko Instruments Inc., Chiba (JP)

( * ) Notice: Subject to any disclaimer, the term of this patent is extended or adjusted under 35 U.S.C. 154(b) by 13 days.

(21) Appl. No.: 13/092,585

(22) Filed: Apr. 22, 2011

(65) Prior Publication Data

US 2011/0273232 A1 Nov. 10, 2011

(30) Foreign Application Priority Data

May 7, 2010 (JP) ................................. 2010-107656

(51) Int. Cl.
*H03F 3/45* (2006.01)
(52) U.S. Cl. ........................................ 330/253; 330/255
(58) Field of Classification Search .................. 330/253, 330/255, 257
See application file for complete search history.

(56) References Cited

U.S. PATENT DOCUMENTS

| | | | | |
|---|---|---|---|---|
| 5,311,145 A | * | 5/1994 | Huijsing et al. | 330/255 |
| 6,614,302 B2 | * | 9/2003 | Abe | 330/253 |
| 7,157,970 B2 | * | 1/2007 | Dawes | 330/253 |
| 8,193,861 B2 | * | 6/2012 | Tsuzaki | 330/253 |

FOREIGN PATENT DOCUMENTS

JP 2005-223627 A 8/2005
* cited by examiner

*Primary Examiner* — Khanh V Nguyen
(74) *Attorney, Agent, or Firm* — Brinks Hofer Gilson & Lione

(57) ABSTRACT

Provided is a differential amplifier circuit in which an offset voltage is independent from input voltages. A first correction current generation circuit and a second correction current generation circuit are provided and configured to cause the same current as a current flowing through a folded cascode amplifying stage to flow into an output stage. Accordingly, transistors included in the folded cascode amplifying stage and transistors included in the output stage have the same bias condition.

4 Claims, 3 Drawing Sheets

DIFFERENTIAL AMPLIFIER CIRCUIT

RELATED APPLICATIONS

This application claims priority under 35 U.S.C. §119 to Japanese Patent Application No. 2010-107656 filed on May 7, 2010, the entire content of which is hereby incorporated by reference.

BACKGROUND OF THE INVENTION

1. Field of the Invention

The present invention relates to a differential amplifier circuit, and more specifically, to a rail to rail input/output differential amplifier circuit.

2. Description of the Related Art

A conventional differential amplifier circuit is described. FIG. 3 is a circuit diagram illustrating the conventional differential amplifier circuit.

The conventional rail to rail input/output differential amplifier circuit includes a first input stage formed of a PMOS transistor 61 and PMOS transistors 65 and 66, a second input stage formed of an NMOS transistor 71 and NMOS transistors 75 and 76, and a folded cascode amplifying stage formed of PMOS transistors 62 and 63 and NMOS transistors 72 and 73 (see, for example, Japanese Patent Application Laid-open No. 2005-223627 (FIG. 9)). The conventional differential amplifier circuit further includes an output stage formed of a PMOS transistor 64 and an NMOS transistor 74 so as to have a wide output voltage range.

Drain currents of the PMOS transistors 61 to 66 are drain currents I61 to I66, respectively. Drain currents of the NMOS transistors 71 to 76 are drain currents I71 to I76, respectively. An input voltage at an input terminal inp is Vinp, and an input voltage at an input terminal inn is Vinn. Here, the drain currents I62 and I63 are defined as a current 2I, and a current flowing into a drain of the NMOS transistor 73 is defined as a current IB.

The differential amplifier circuit having the above-mentioned configuration operates as follows.

If the input voltage Vinp becomes higher than the input voltage Vinn, the drain current I65 becomes smaller than the drain current I66, and the drain current I75 becomes larger than the drain current I76. The current IB (IB=2I−I75+I65) becomes smaller than the drain current I73 (I73=I72=2I−I76+I66), and hence a gate voltage of the NMOS transistor 74 is reduced. Therefore, an ON-state resistance of the NMOS transistor 74 is increased to increase an output voltage Vout.

On this occasion, when the input voltage Vinp and the input voltage Vinn are close to VDD, the PMOS transistor 61 operates in the non-saturation region, and the differential amplifier circuit operates with the NMOS transistors 75 and 76 serving as inputs. On the other hand, when the input voltage Vinp and the input voltage Vinn are close to VSS, the NMOS transistor 71 operates in the non-saturation region, and the differential amplifier circuit operates with the PMOS transistors 65 and 66 serving as inputs. Further, when the input voltage Vinp and the input voltage Vinn are intermediate voltages, the differential amplifier circuit operates with both of the NMOS transistors 75 and 76 and the PMOS transistors 65 and 66 serving as the inputs.

Through the above-mentioned operations, the conventional differential amplifier circuit can perform rail to rail input/output.

However, in the conventional differential amplifier circuit described above, when the input voltage Vinp and the input voltage Vinn are close to VDD or VSS, the currents flowing into the drains of the NMOS transistors 72 and 73 vary, but the current flowing into the drain of the NMOS transistor 74 is constant. Therefore, if the input voltage levels to the differential pair are different, the bias condition is different between the NMOS transistors 72 and 73 and the NMOS transistor 74. In other words, the conventional differential amplifier circuit suffers from a problem that an offset voltage is changed if the input voltage levels to the differential pair are different.

SUMMARY OF THE INVENTION

The present invention has been made in view of the above-mentioned problem, and provides a differential amplifier circuit in which an offset voltage is independent from input voltage levels to a differential pair.

In order to solve the above-mentioned problem, the present invention provides a differential amplifier circuit, including: a first input stage including a pair of PMOS transistors and a first current source, for causing an output current to flow based on two input voltages; a second input stage including a pair of NMOS transistors and a second current source, for causing an output current to flow based on the two input voltages; a folded cascode amplifying stage, into which the output current of the first input stage flows and from which the output current of the second input stage is drawn, thereby outputting a voltage; an output stage for outputting an output voltage based on the voltage of the folded cascode amplifying stage; a first correction current generation circuit for causing a first correction current to flow into the output stage based on a supply current of the first current source; and a second correction current generation circuit for drawing a second correction current from the output stage based on a supply current of the second current source.

According to the present invention, each of the first correction current generation circuit and the second correction current generation circuit is configured to cause the same current as that of the folded cascode amplifying stage to flow into the output stage. Accordingly, the transistors included in the folded cascode amplifying stage and the transistors included in the output stage have the same bias condition. Therefore, the offset voltage of the differential amplifier circuit is independent from the input voltages.

DETAILED DESCRIPTION OF THE PREFERRED EMBODIMENTS

Referring to the accompanying drawings, embodiments of the present invention are described below.

Figure 1:
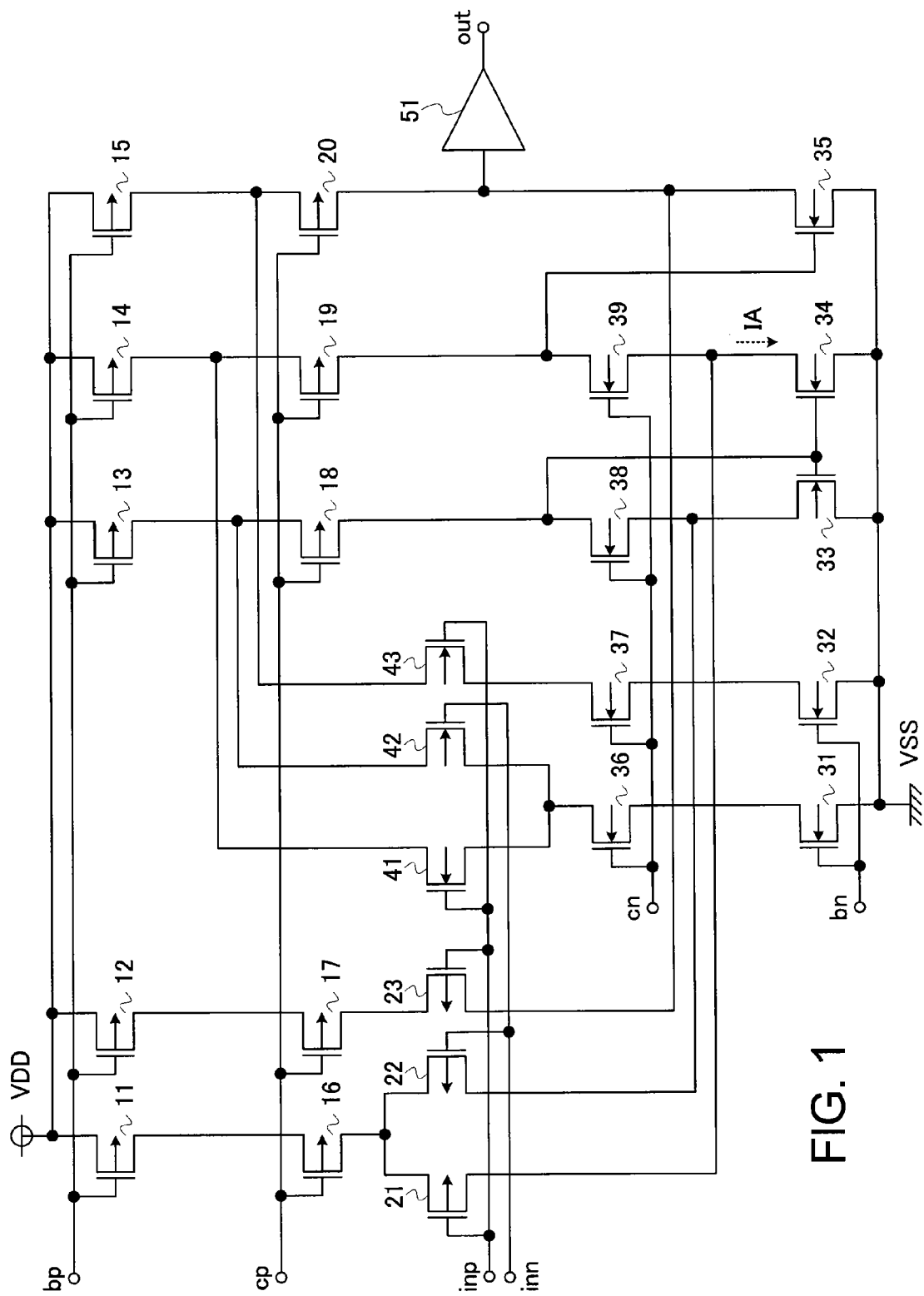
FIG. 1 is a circuit diagram illustrating a differential amplifier circuit according to an embodiment of the present invention.

FIG. 1 is a circuit diagram illustrating a differential amplifier circuit according to an embodiment of the present invention.

The differential amplifier circuit includes PMOS transistors 11 to 23, NMOS transistors 31 to 39, NMOS transistors 41 to 43, and a buffer 51. The differential amplifier circuit further includes a first bias terminal bp, a second bias terminal bn, a first cascode terminal cp, a second cascode terminal cn, a non-inverting input terminal inp, an inverting input terminal inn, and an output terminal out.

The PMOS transistor 11, the PMOS transistor 16, and the PMOS transistors 21 and 22 together form a first input stage. The PMOS transistor 12, the PMOS transistor 17, and the PMOS transistor 23 together form a first correction current generation circuit. The NMOS transistor 31, the NMOS transistor 36, and the NMOS transistors 41 and 42 together form a second input stage. The NMOS transistor 32, the NMOS transistor 37, and the NMOS transistor 43 together form a second correction current generation circuit. The PMOS transistors 13 and 14, the PMOS transistors 18 and 19, the NMOS transistors 33 and 34, and the NMOS transistors 38 and 39 together form a folded cascode amplifying stage. The PMOS transistor 15, the PMOS transistor 20, and the NMOS transistor 35 together form an output stage. Further, the PMOS transistors 16 to 20 and the NMOS transistors 36 to 39 together form cascode circuits, respectively. The PMOS transistors 11 to 15 and the NMOS transistors 31 and 32 together form current sources, respectively.

The PMOS transistors 11 to 15 each have a gate connected to the first bias terminal by and a source connected to a power supply terminal. The PMOS transistors 11 to 15 have drains connected to sources of the PMOS transistors 16 to 20, respectively. The PMOS transistors 16 to 20 each have a gate connected to the first cascode terminal cp. The PMOS transistor 16 has a drain connected to sources of the PMOS transistors 21 and 22. The PMOS transistors 17 to 20 have drains connected to a source of the PMOS transistor 23, drains of the NMOS transistors 38 and 39, and a drain of the NMOS transistor 35, respectively.

The NMOS transistors 31 and 32 each have a gate connected to the second bias terminal bn and a source connected to a ground terminal. The NMOS transistors 31 and 32 have drains connected to sources of the NMOS transistors 36 and 37, respectively. The NMOS transistors 33 and 34 each have a gate connected to a connection point between the drain of the PMOS transistor 18 and the drain of the NMOS transistor 38 and a source connected to the ground terminal. The NMOS transistors 33 and 34 have drains connected to sources of the NMOS transistors 38 and 39, respectively. The NMOS transistor 35 has a gate connected to a connection point between the drain of the PMOS transistor 19 and the drain of the NMOS transistor 39, and a source connected to the ground terminal. The NMOS transistors 36 to 39 each have a gate connected to the second cascode terminal cn. The NMOS transistor 36 has a drain connected to sources of the NMOS transistors 41 and 42. The NMOS transistor 37 has a drain connected to a source of the NMOS transistor 43.

The PMOS transistor 21 has a gate connected to the non-inverting input terminal inp and a drain connected to a connection point between the source of the NMOS transistor 39 and the drain of the NMOS transistor 34. The PMOS transistor 22 has a gate connected to the inverting input terminal inn and a drain connected to a connection point between the source of the NMOS transistor 38 and the drain of the NMOS transistor 33. The PMOS transistor 23 has a gate connected to the non-inverting input terminal inp and a drain connected to a connection point between the drain of the PMOS transistor 20 and the drain of the NMOS transistor 35.

The NMOS transistor 41 has a gate connected to the non-inverting input terminal inp and a drain connected to a connection point between the drain of the PMOS transistor 14 and the source of the PMOS transistor 19. The NMOS transistor 42 has a gate connected to the inverting input terminal inn and a drain connected to a connection point between the drain of the PMOS transistor 13 and the source of the PMOS transistor 18. The NMOS transistor 43 has a gate connected to the non-inverting input terminal inp and a drain connected to a connection point between the drain of the PMOS transistor 15 and the source of the PMOS transistor 20.

The buffer 51 has an input terminal connected to a connection point between the drain of the PMOS transistor 20 and the drain of the NMOS transistor 35. The buffer 51 has an output terminal connected to the output terminal out of the differential amplifier circuit.

In this circuit, a voltage of the power supply terminal is a power supply voltage VDD, a voltage of the ground terminal is a ground voltage VSS, a voltage of the first bias terminal by is a bias voltage Vbp, a voltage of the second bias terminal bn is a bias voltage Vbn, a voltage of the first cascode terminal cp is a cascode voltage Vcp, a voltage of the second cascode terminal cn is a cascode voltage Vcn, a voltage of the non-inverting input terminal inp is an input voltage Vinp, a voltage of the inverting input terminal inn is an input voltage Vinn, and a voltage of the output terminal out is an output voltage Vout.

Further, drain currents of the PMOS transistors 21 to 23 are drain currents I21 and I22 and a first correction current I23, respectively. Drain currents of the PMOS transistors 11 to 15 are drain currents I11 to I15, respectively. Drain currents of the NMOS transistors 41 to 43 are drain currents I41 and I42 and a second correction current I43, respectively. Drain currents of the NMOS transistors 31 to 35 are drain currents I31 to I35, respectively. A current flowing into the drain of the NMOS transistor 34 is a current IA.

The first input stage causes the drain currents I21 and I22 to flow based on the input voltage Vinp and the input voltage Vinn. The second input stage causes the drain currents I41 and I42 to flow based on the input voltage Vinp and the input voltage Vinn. The drain currents I21 and I22 flow into the folded cascode amplifying stage and the drain currents I41 and I42 are drawn therefrom, with the result that the folded cascode amplifying stage outputs an output voltage. The output stage outputs an output voltage based on the voltage output from the folded cascode amplifying stage. The buffer 51 drives the output voltage of the output stage, and outputs the output voltage Vout. The first correction current generation circuit causes the first correction current I23 to flow into the output stage from the current source formed of the PMOS transistor 12, based on a supply current of the current source formed of the PMOS transistor 11. The second correction current generation circuit draws the second correction current I43 from the output stage to the current source formed of the NMOS transistor 32 based on a supply current of the current source formed of the NMOS transistor 31.

Next, operations of the differential amplifier circuit are described.

When the input voltage Vinp and the input voltage Vinn are close to VDD, the PMOS transistor 11 operates in the non-saturation region, and the differential amplifier circuit operates with the NMOS transistors 41 and 42 serving as inputs. On the other hand, when the input voltage Vinp and the input voltage Vinn are close to VSS, the NMOS transistor 31 operates in the non-saturation region, and the differential amplifier circuit operates with the PMOS transistors 21 and 22 serving as inputs. Further, when the input voltage Vinp and the input voltage Vinn are intermediate voltages, the differential amplifier circuit operates with both of the NMOS transistors 41 and 42 and the PMOS transistors 21 and 22 serving as the inputs.

The PMOS transistor 11 and the PMOS transistors 13 to 15 have the same size. The PMOS transistors 16 to 20 have the same size. The PMOS transistors 21 to 23 have the same size. The NMOS transistor 31 and the NMOS transistors 33 to 35 have the same size. The NMOS transistors 36 to 39 have the same size. The NMOS transistors 41 to 43 have the same size. Further, the PMOS transistor 12 has half the size of the PMOS transistor 11, and the NMOS transistor 32 has half the size of the NMOS transistor 31.

First, an operation when the input voltage Vinp and the input voltage Vinn are the intermediate voltages is described. In this case, the drain currents I13 to I15 are each defined as a current 2I. The PMOS transistors 11 and 12 and the NMOS transistors 31 and 32 each operate in the saturation region. Accordingly, when each of the drain current I11 and the drain current I31 is the current 2I, each of the drain current I12 and the drain current I32 is a current I.

In the latter stage of the differential amplifier circuit, the drain current I41 is drawn from the drain current I14, and a total current (I14−I41+I21) of the current (I14−I41) and the drain current I21 corresponds to the current IA. Further, the drain current I42 is drawn from the drain current I13, and a total current (I13−I42+I22) of the current (I13−I42) and the drain current I22 corresponds to the drain current I33. The drain current (I13−I42+I22) corresponds to the drain current I34 due to a current mirror circuit formed of the NMOS transistors 33 and 34. Based on the relationship between the current (IA=I14−I41+I21) and the drain current (I33=I34=I13−I42+I22), a gate voltage of the NMOS transistor 35 is determined.

In addition, in the latter stage of the differential amplifier circuit, the second correction current I43 is drawn from the drain current I15, and a total current (I15−I43+I23) of the current (I15−I43) and the first correction current I23 corresponds to the drain current I35.

On this occasion, if the input voltage Vinp becomes higher than the input voltage Vinn, the drain current I21 becomes smaller than the drain current I22, and the drain current I41 becomes larger than the drain current I42. Then, because both of the drain currents I13 and I14 are the current 2I, the current (IA=2I−I41+I21) becomes smaller than the drain current (I33=I34=2I−I42+I22), and accordingly the gate voltage of the NMOS transistor 35 is reduced. Therefore, an ON-state resistance of the NMOS transistor 35 is increased, and hence an input voltage of the buffer 51 is increased and the output voltage Vout of the buffer 51 is increased.

Further, if the input voltage Vinp becomes lower than the input voltage Vinn, similarly to the above, the output voltage Vout of the buffer 51 is reduced.

Next, an operation when the input voltage Vinp and the input voltage Vinn are close to VDD is described. In this case, the drain currents I13 to I15 are each defined as the current 2I. The PMOS transistors 11 and 12 each operate in the non-saturation region, and the NMOS transistors 31 and 32 each operate in the saturation region. Accordingly, almost no drain current I11 flows, and the drain current I31 corresponds to the current 2I. Further, almost no drain current I12 flows, and the drain current I32 corresponds to the current I. In other words, almost no drain currents I21 and I22 flow and almost no first correction current I23 flows, either.

On this occasion, if the input voltage Vinp becomes higher than the input voltage Vinn, almost no drain currents I21 and I22 flow, but similarly to the above, the output voltage Vout of the buffer 51 is increased.

Further, if the input voltage Vinp becomes lower than the input voltage Vinn, similarly to the above, the output voltage Vout of the buffer 51 is reduced.

Next, an operation when the input voltage Vinp and the input voltage Vinn are close to VSS is described. In this case, the drain currents I13 to I15 are each defined as the current 2I. The PMOS transistors 11 and 12 each operate in the saturation region, and the NMOS transistors 31 and 32 each operate in the non-saturation region. Accordingly, the drain current I11 corresponds to the current 2I, and almost no drain current I31 flows. Further, the drain current I12 corresponds to the current I, and almost no drain current I32 flows. In other words, almost no drain currents I41 and I42 flow and almost no second correction current I43 flows, either.

On this occasion, if the input voltage Vinp becomes higher than the input voltage Vinn, almost no drain currents I41 and I42 flow, but similarly to the above, the output voltage Vout of the buffer 51 is increased.

Further, if the input voltage Vinp becomes lower than the input voltage Vinn, similarly to the above, the output voltage Vout of the buffer 51 is reduced.

In the case where the input voltage Vinp and the input voltage Vinn are the intermediate voltages, if the differential amplifier circuit is used as an amplifier, the non-inverting input terminal inp and the inverting input terminal inn are imaginarily short-circuited. Accordingly, the input voltage Vinp and the input voltage Vinn are equal to each other, and hence the drain current I42 and the second correction current I43 are equal to each other and the drain current I22 and the first correction current I23 are equal to each other. Therefore, the drain current I35 is equal to the drain current I33. Further, if the differential amplifier circuit is used as a comparator, what is important is the detection accuracy in detecting the input voltages at a time when an output voltage of the comparator is inverted. In this case, the input voltage Vinp and the input voltage Vinn are equal to each other, and hence the drain current I42 and the second correction current I43 are equal to each other and the drain current I22 and the first correction current I23 are equal to each other. Therefore, the drain current I35 is equal to the drain current I33. In other words, the drain currents I33 to I35 are equal to one another.

When the input voltage Vinp and the input voltage Vinn are close to VDD, the PMOS transistors 11 and 12 each operate in the non-saturation region. When the input voltage Vinp and the input voltage Vinn are close to VSS, the NMOS transistors 31 and 32 each operate in the non-saturation region. However, as described above, the drain current I42 and the second correction current I43 are equal to each other and the drain current I22 and the first correction current I23 are equal to each other. Therefore, the drain current I35 is equal to the drain current I33. In other words, the drain currents I33 to I35 are equal to one another.

Accordingly, even if the input voltage Vinp and the input voltage Vinn fluctuate between VDD and VSS, the bias condition of the NMOS transistor 35 with respect to the NMOS transistors 33 and 34 is always the same. Therefore, an offset voltage of the differential amplifier circuit is independent from the input voltage Vinp and the input voltage Vinn.

Figure 2:
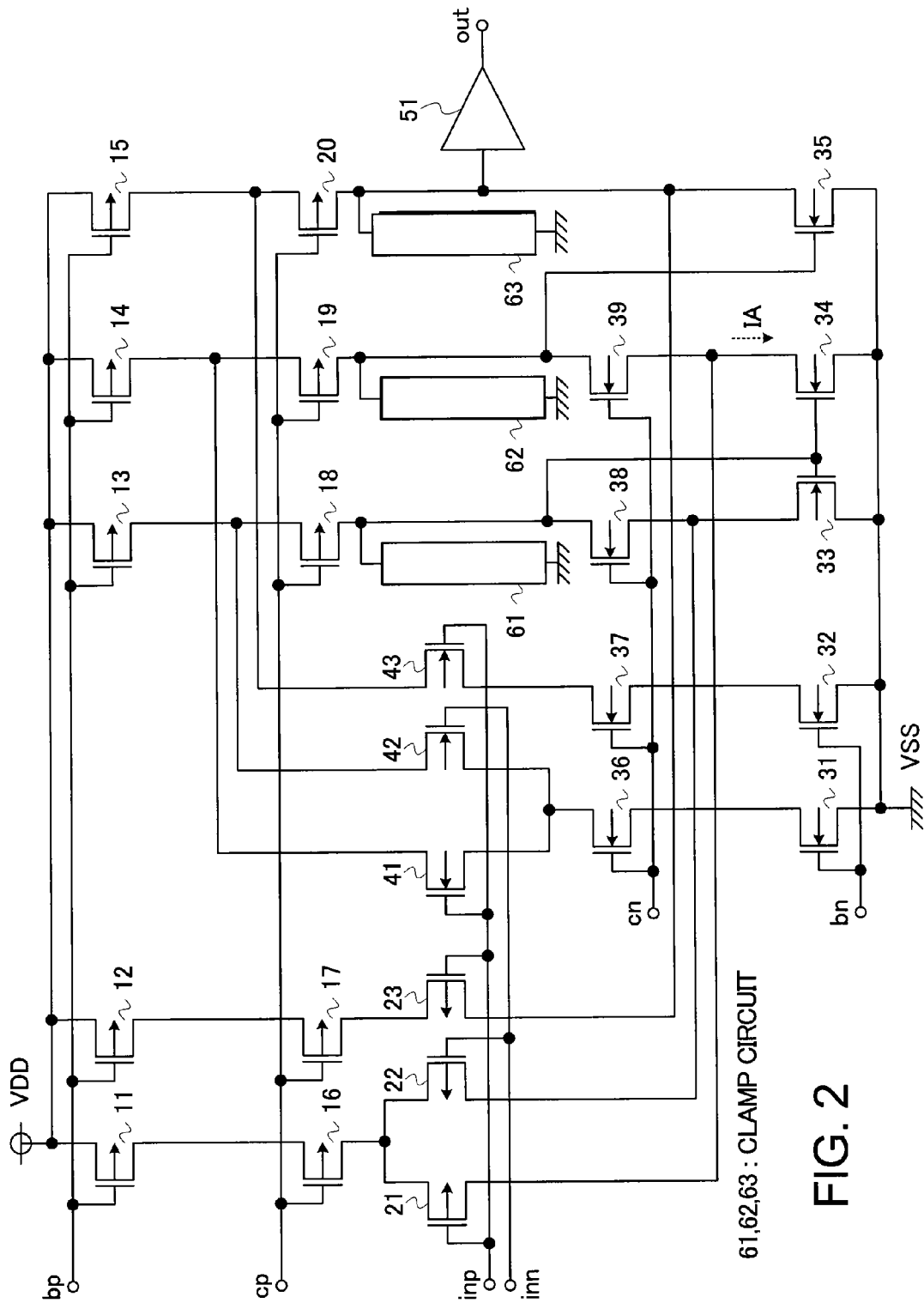
FIG. 2 is a circuit diagram illustrating a differential amplifier circuit according to another embodiment of the present invention.
Figure 3:
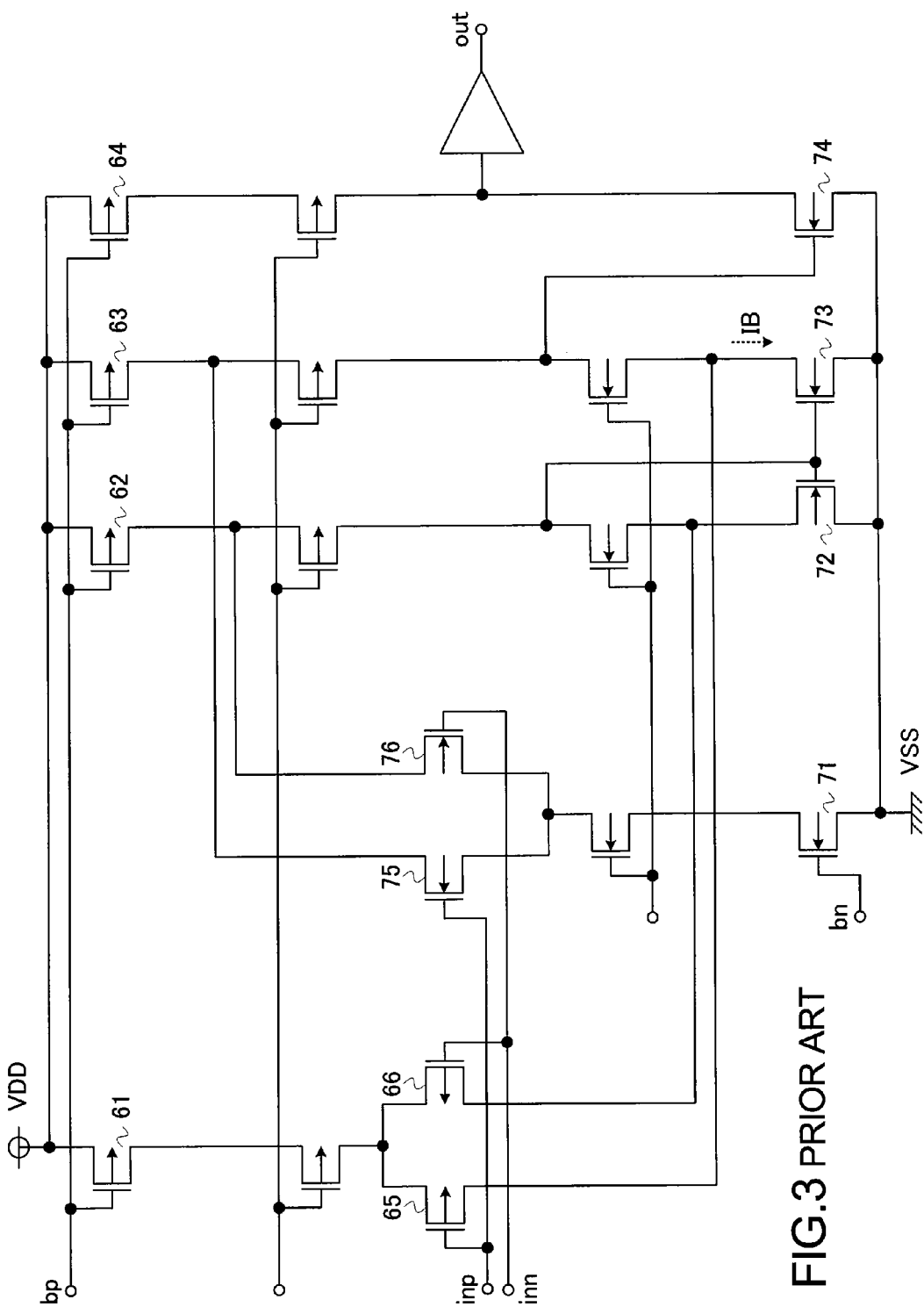
FIG. 3 is a circuit diagram illustrating a conventional differential amplifier circuit.

FIG. 2 is a circuit diagram illustrating a differential amplifier circuit according to another embodiment of the present invention.

In the differential amplifier circuit of FIG. 1, in order to increase the response speed, a clamp circuit 62 may be provided so as to limit the voltage swing. In this case, there remains a problem that an offset voltage is generated because the bias condition differs depending on a leakage current of the clamp circuit 62. In order to solve the problem, the differential amplifier circuit of FIG. 2 is provided with a clamp circuit 61 and a clamp circuit 63.

The clamp circuit 61 is provided between a connection point between the drain of the PMOS transistor 18 and the drain of the NMOS transistor 38 (i.e., one end of the current mirror circuit), and the ground terminal. The clamp circuit 62 is provided between a connection point between the drain of the PMOS transistor 19 and the drain of the NMOS transistor 39 (i.e., another end of the current mirror circuit), and the ground terminal. The clamp circuit 63 is provided between a connection point between the drain of the PMOS transistor 20 and the drain of the NMOS transistor 35, and the ground terminal. The clamp circuits 61 to 63 operate so that the voltages at the respective connection points are prevented from exceeding a predetermined voltage.

The clamp circuits 61 to 63 have the same circuit configuration, and hence leakage currents of the clamp circuits 61 to 63 are equal to one another, and the drain currents I35 to I35 of the NMOS transistors 33 to 35 are equal to one another.

Note that, in FIG. 1, the gates of the PMOS transistor 23 and the NMOS transistor 43 are connected to the non-inverting input terminal inp. Alternatively, although not illustrated, the gates may be connected to the inverting input terminal inn. Further, although not illustrated, the gate of the PMOS transistor 23 may be connected to the non-inverting input terminal inp and the gate of the NMOS transistor 43 may be connected to the inverting input terminal inn. Still further, although not illustrated, the gate of the PMOS transistor 23 may be connected to the inverting input terminal inn and the gate of the NMOS transistor 43 may be connected to the non-inverting input terminal inp.

What is claimed is:

1. A differential amplifier circuit, comprising:
   a first input stage comprising a pair of PMOS transistors and a first current source, for causing an output current to flow based on two input voltages;
   a second input stage comprising a pair of NMOS transistors and a second current source, for causing an output current to flow based on the two input voltages;
   a folded cascode amplifying stage, into which the output current of the first input stage flows and from which the output current of the second input stage is drawn, thereby outputting a voltage;
   an output stage for outputting an output voltage based on the voltage of the folded cascode amplifying stage;
   a first correction current generation circuit for causing a first correction current to flow into the output stage based on a supply current of the first current source; and
   a second correction current generation circuit for drawing a second correction current from the output stage based on a supply current of the second current source.

2. A differential amplifier circuit according to claim 1,
   wherein the first correction current generation circuit comprises:
      a third PMOS transistor of the same size as a size of one of the pair of PMOS transistors, the third PMOS transistor including a gate connected to a gate of the one of the pair of PMOS transistors; and
      a third current source of half a size of the first current source, the third current source being provided to a source of the third PMOS transistor, and
   wherein the second correction current generation circuit comprises:
      a third NMOS transistor of the same size as a size of one of the pair of NMOS transistors, the third NMOS transistor including a gate connected to a gate of the one of the pair of NMOS transistors; and
      a fourth current source of half a size of the second current source, the fourth current source being provided to a source of the third NMOS transistor.

3. A differential amplifier circuit according to claim 1, further comprising:
   a first clamp circuit provided to one end of a current mirror circuit included in the folded cascode amplifying stage;
   a second clamp circuit provided to another end of the current mirror circuit; and
   a third clamp circuit provided to an output terminal of the output stage.

4. A differential amplifier circuit according to claim 2, further comprising:
   a first clamp circuit provided to one end of a current mirror circuit included in the folded cascode amplifying stage;
   a second clamp circuit provided to another end of the current mirror circuit; and
   a third clamp circuit provided to an output terminal of the output stage.

* * * * *